United States Patent
Westerberg et al.

(10) Patent No.: US 10,079,319 B2
(45) Date of Patent: Sep. 18, 2018

(54) SOLAR CELL FABRICATION USING LASER PATTERNING OF ION-IMPLANTED ETCH-RESISTANT LAYERS AND THE RESULTING SOLAR CELLS

(71) Applicant: SUNPOWER CORPORATION, San Jose, CA (US)

(72) Inventors: Staffan Westerberg, Sunnyvale, CA (US); Alejandro Levander, El Granada, CA (US); Peter John Cousins, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 190 days.

(21) Appl. No.: 14/971,846

(22) Filed: Dec. 16, 2015

(65) Prior Publication Data

US 2017/0179310 A1    Jun. 22, 2017

(51) Int. Cl.
| | |
|---|---|
| H01L 31/0216 | (2014.01) |
| H01L 31/047 | (2014.01) |
| H01L 31/0236 | (2006.01) |
| H01L 31/0224 | (2006.01) |
| H01L 31/18 | (2006.01) |

(52) U.S. Cl.
CPC .. *H01L 31/02366* (2013.01); *H01L 31/02167* (2013.01); *H01L 31/022441* (2013.01); *H01L 31/047* (2014.12); *H01L 31/1804* (2013.01); *H01L 31/1864* (2013.01); *H01L 31/1868* (2013.01)

(58) Field of Classification Search
CPC ....... H01L 31/022441; H01L 31/02245; H01L 31/022458; H01L 31/0682; H01L 31/035272; H01L 31/035281; H01L 31/03529

See application file for complete search history.

(56) References Cited

U.S. PATENT DOCUMENTS

| | | | | |
|---|---|---|---|---|
| 2009/0308457 | A1* | 12/2009 | Smith | ............. H01L 31/022441 136/261 |
| 2012/0266951 | A1 | 10/2012 | Li et al. | |

(Continued)

FOREIGN PATENT DOCUMENTS

| | | |
|---|---|---|
| KR | 10-2012-0004174 | 1/2012 |
| WO | WO-2012-158992 | 11/2012 |

OTHER PUBLICATIONS

Robby Peibst et al., "Building blocks for back-junction back-contacted cells and modules with ion-implanted poly-Si junctions", 2014 IEEE 40th Photovoltaic Specialist Conference, Jun. 8-13, 2014, p. 0852-0856.*

(Continued)

*Primary Examiner* — Eric R Smith
(74) *Attorney, Agent, or Firm* — Schwabe, Williamson & Wyatt, P.C.

(57) ABSTRACT

Solar cell fabrication using laser patterning of ion-implanted etch-resistant layers, and the resulting solar cells, are described. In an example, a back contact solar cell includes a maximum concentration of the approximately Gaussian distribution of P-type dopants approximately in the center of each of segmented P-type emitter regions between first and second sides of each of the segmented P-type emitter regions.

21 Claims, 10 Drawing Sheets

(56) References Cited

U.S. PATENT DOCUMENTS

| | | | |
|---|---|---|---|
| 2012/0273040 A1* | 11/2012 | Kim | H01L 31/0682 136/256 |
| 2013/0228902 A1* | 9/2013 | Tomizawa | H01L 29/66757 257/655 |
| 2014/0090701 A1* | 4/2014 | Rim | H01L 31/035272 136/256 |
| 2014/0170800 A1* | 6/2014 | Loscutoff | H01L 31/18 438/72 |
| 2014/0339682 A1* | 11/2014 | Funakoshi | H01L 31/1804 257/620 |
| 2014/0346436 A1* | 11/2014 | Li | H01L 21/02532 257/9 |
| 2015/0144197 A1 | 5/2015 | Cousins et al. | |
| 2015/0243806 A1 | 8/2015 | Hu et al. | |

OTHER PUBLICATIONS

International Search Report and Written Opinion from PCT/US2016/066419 dated Apr. 5, 2017, 10 pgs.

International Preliminary Report on Patentability from PCT/US2016/066419 dated Jun. 19, 2018, 6 pgs.

* cited by examiner

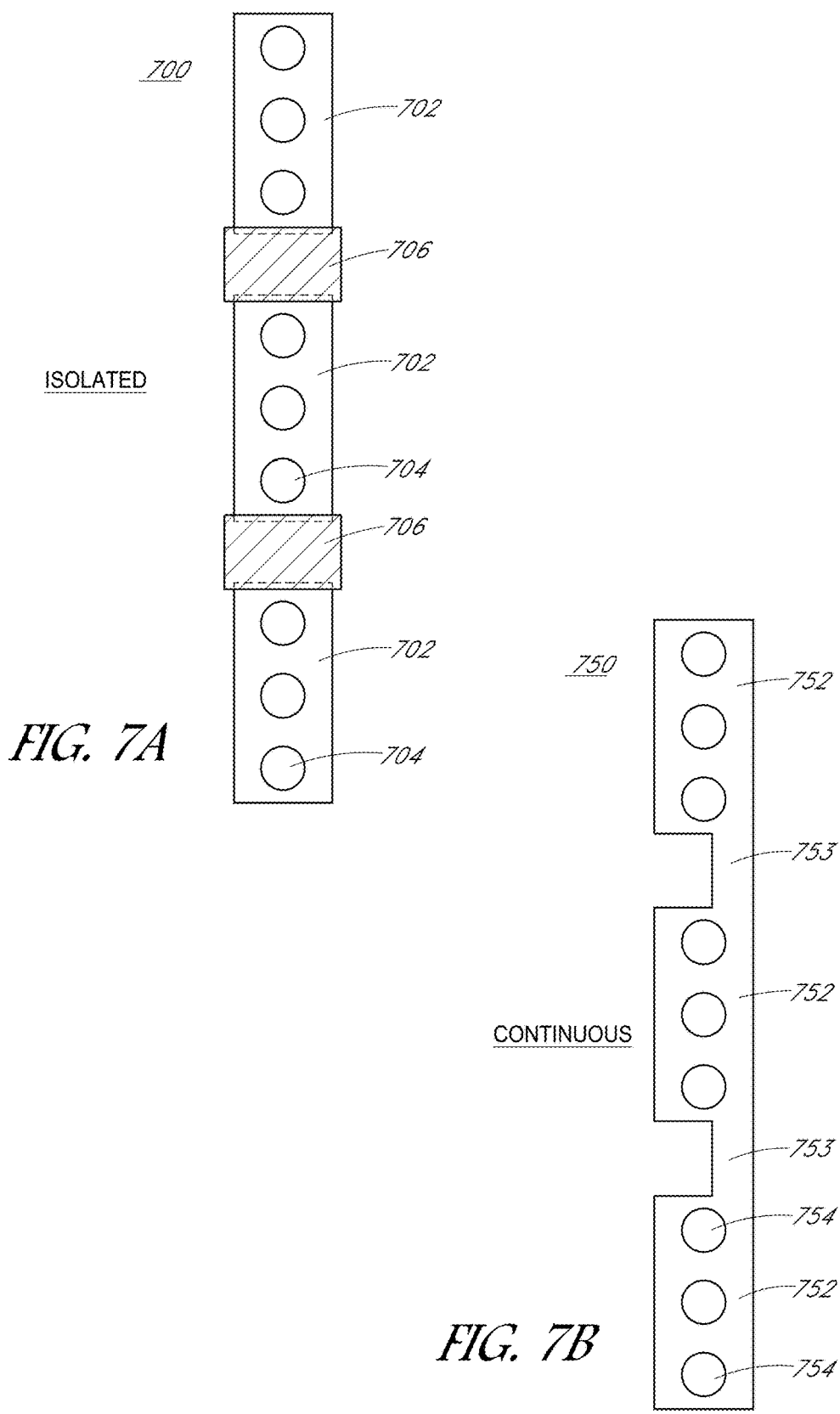

SOLAR CELL FABRICATION USING LASER PATTERNING OF ION-IMPLANTED ETCH-RESISTANT LAYERS AND THE RESULTING SOLAR CELLS

TECHNICAL FIELD

Embodiments of the present disclosure are in the field of renewable energy and, in particular, solar cell fabrication using laser patterning of ion-implanted etch-resistant layers, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIG. 7A illustrates a plan view of an emitter line having no continuity between segments of the emitter line, in accordance with an embodiment of the present disclosure.

FIG. 7B illustrates a plan view of an emitter line having continuity between segments of the emitter line, in accordance with an embodiment of the present disclosure.

DETAILED DESCRIPTION

Figure 1A:
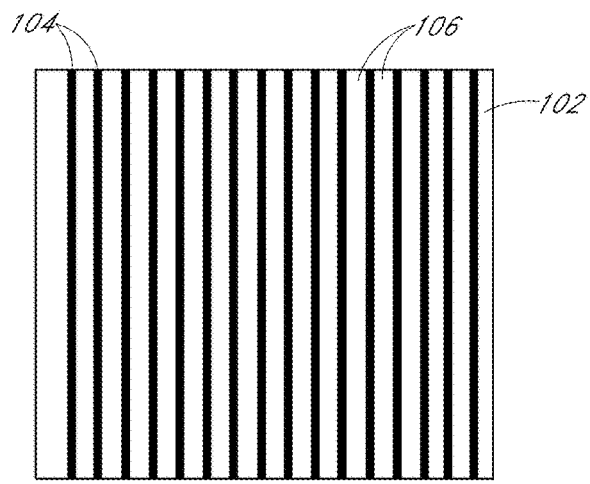
FIGS. 1A-1C illustrate plan views of various stages in the fabrication of a solar cell, in accordance with an embodiment of the present disclosure.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

TERMINOLOGY

The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Solar cell fabrication using laser patterning of ion-implanted etch-resistant layers, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating an emitter region of a solar cell includes forming a semiconductor layer above a semiconductor substrate of a first conductivity type. The method also includes implanting dopant impurity atoms of a second conductivity type in the semiconductor layer to form an implanted region of the semiconductor layer and resulting in a non-implanted region of the semiconductor layer. The method also includes laser scribing at least an uppermost portion of the implanted region of the semiconductor layer to form scribe lines in the implanted region of the semiconductor layer. The method also includes removing the non-implanted region of the semiconductor layer and remaining portions of the semiconductor layer in the scribe lines using a selective etch process preserving remaining non-scribed portions of the implanted region of the semiconductor layer, the removing forming trenches in the semiconductor substrate in locations below the non-implanted region of the semiconductor layer and in locations below the scribe lines. The method also includes annealing the semiconductor substrate to form an emitter region of the second conductivity type from the remaining non-scribed portions of the implanted region of the semiconductor layer and to form a region of dopant impurity atoms of the second conductivity type in the semiconductor substrate below the emitter region.

In another embodiment, a method of fabricating alternating N-type and P-type emitter regions of a solar cell includes forming a silicon layer above an N-type single crystalline silicon substrate. The method also includes forming, by ion implantation, alternating N-type and P-type lines in the silicon layer with non-implanted regions of the silicon layer remaining between the alternating N-type and P-type lines. The method also includes breaking a continuity of the P-type lines using a laser scribing process to remove portions of the P-type lines and leave remaining segmented P-type lines with gaps between segments of the P-type lines. The method also includes etching to remove the non-implanted regions of the silicon layer remaining between the alternating N-type and P-type lines and in the gaps, the etching forming trenches in the N-type single crystalline silicon substrate between the alternating N-type and P-type lines and in locations of the gaps between segments of the P-type lines. The method also includes, subsequent to the etching, annealing the N-type single crystalline silicon substrate to form N-type emitter regions from the N-type lines and segmented P-type emitter regions from the segmented P-type lines.

Also disclosed herein are solar cells. In one embodiment, a back contact solar cell includes an N-type single crystalline silicon substrate having a light-receiving surface and a back surface. Alternating continuous N-type emitter regions and segmented P-type emitter regions are disposed on the back surface of the N-type single crystalline silicon substrate, with gaps between segments of the segmented P-type emitter regions. Trenches are included in the N-type single crystalline silicon substrate between the alternating continuous N-type emitter regions and segmented P-type emitter regions and in locations of the gaps between segments of the segmented P-type emitter regions. An approximately Gaussian distribution of P-type dopants is included in the N-type single crystalline silicon substrate below the segmented P-type emitter regions. A maximum concentration of the approximately Gaussian distribution of P-type dopants is approximately in the center of each of the segmented P-type emitter regions between first and second sides of each of the segmented P-type emitter regions. Substantially vertical P/N junctions are included in the N-type single crystalline silicon substrate at the trenches formed in locations of the gaps between segments of the segmented P-type emitter regions.

One or more embodiments described herein involves use of ion implantation to modify the etch resistance of amorphous or crystalline silicon surfaces. For example, implanting with high doses of nitrogen or boron can form etch resistant B-rich silicon or silicon nitride layers respectively. Ion implantation processes are typically patterned by depositing and patterning hard mask materials prior to implant. In one or more embodiments described herein, the arbitrary pattern generating ability of laser scanning ablation processes is exploited to pattern implanted films. In one such embodiment, following blanket or patterned ion implantation, laser ablation is used to selectively remove areas of etch resistant silicon. Subsequent etch operations are then implemented to define the desired features in the implanted layer.

To provide context, there is a need to have improved control over the patterning of ion implanted etch resistant layers, for example for solar cell fabrication. Although ion-implant processes can involve patterning using a shadow mask, such patterns are generally limited to one-dimension due to throughput considerations. The resulting one-dimensional patterns can be made, for example, by passing a wafer underneath a stationary mask. However, there are instances where a two-dimensional pattern is preferred. In addition, due to the Gaussian distribution of implanted dose across a one-dimensional (1D) feature, the implanted doping is often non-uniform. One consequence of lower doping at the edges of implant-defined features is less boron out-diffusion and, therefore, a less abrupt p-n junction at a trench/p-polysilicon interface resulting in a higher reverse breakdown voltage. One approach to solve such an issue is to increase the overall dose. However, increasing the overall dose may not meet high volume production needs in terms of processing throughput times. Another approach is to adjust the mask pattern in order to increase the dose at the edges of the lines. However, such masks are very challenging to fabricate and the design criteria for such masks is very stringent.

Addressing one or more of the above issues, in accordance with an embodiment of the present disclosure, laser patterning of implanted lines is implemented to allow the formation of trench/p-polysilicon junctions at the center of the implanted line where there is a higher boron implant dose and higher out-diffusion. An overlapping pulsed laser scribe can be arbitrarily scanned across a wafer to ablate implanted etch stop regions (e.g., regions having a dopant concentration of etch resistant dopant impurity atoms). In a specific embodiment, a green picosecond pulsed laser is used with a power approximately in the range of around 2000-3000 W to ablate the etch stop area. After ablating the etch stop, etch/texturing procedures reveal the combined impact of implant and laser patterning. For example, the center of a cut line contains the most implanted boron and, therefore, the most out-diffusion. The end result may be a lowering of the breakdown voltage due to a more abrupt p-n junction between the trench and p-polysilicon out-diffusion. One or more embodiments of the present disclosure enable the use of lower cost high-throughput ion implant technology combined with high efficiency passivated contacts, while maintaining an industry leading reliability and shade performance through a low reverse breakdown voltage for the resulting cells.

Figure 1B:
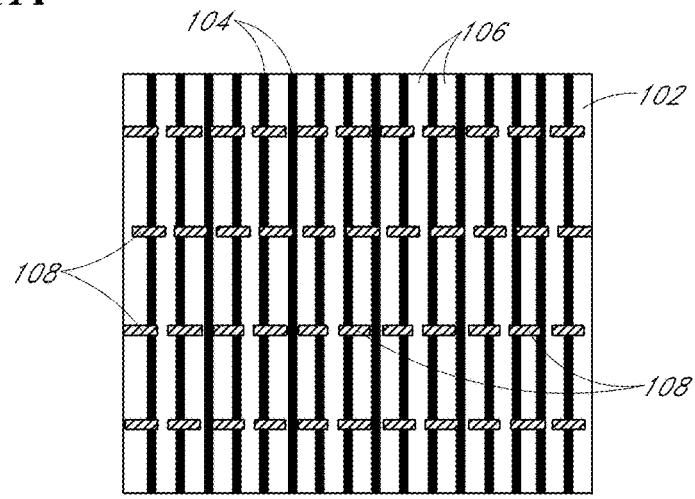
Figure 1C:
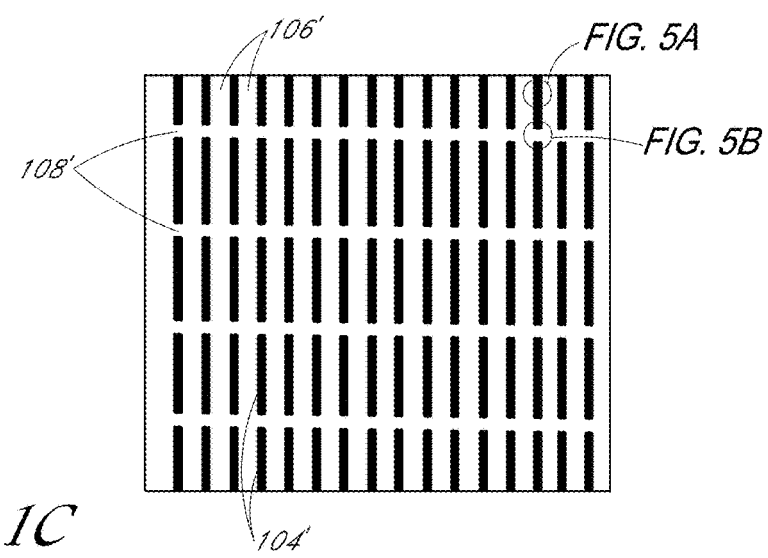
Figure 2:
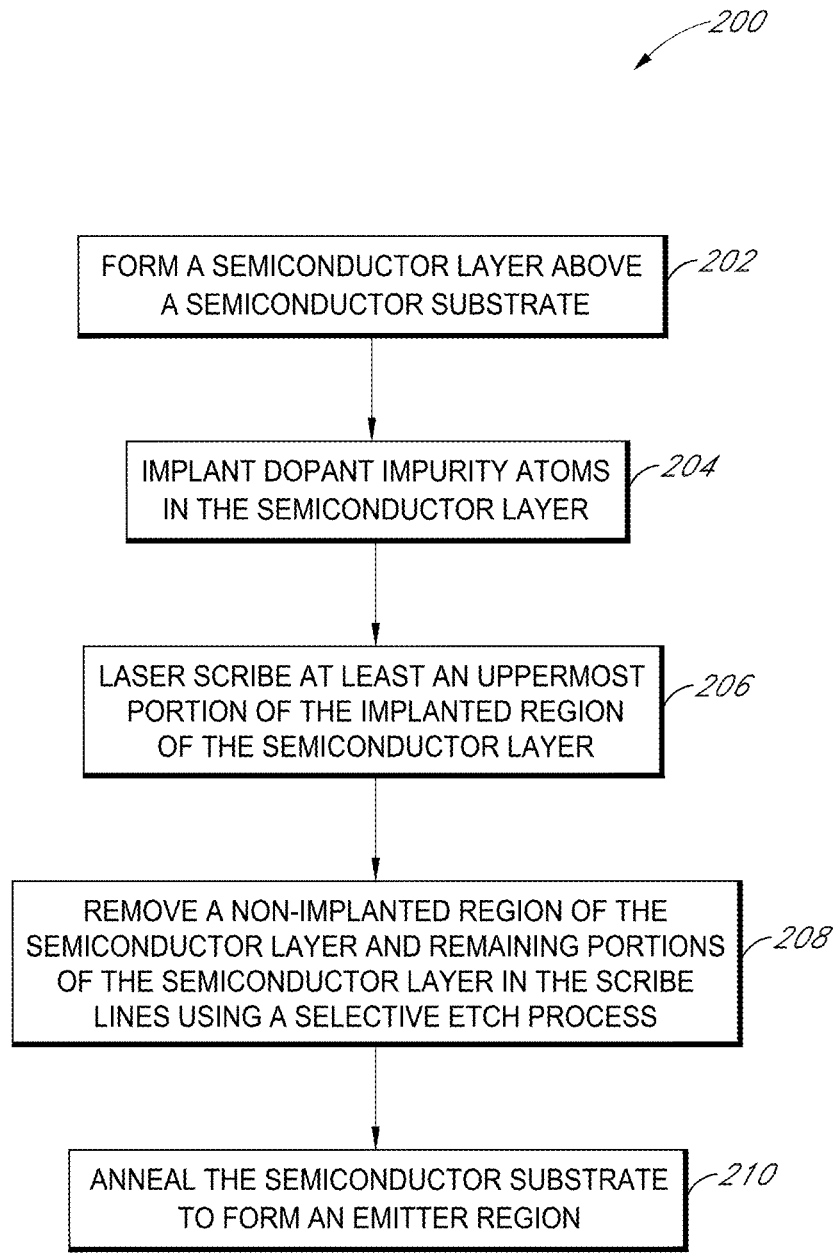
FIG. 2 is a flowchart listing operations in a method of fabricating a solar cell as corresponding to FIGS. 1A-1C, in accordance with an embodiment of the present disclosure.

In an exemplary process flow using implant induced etch selectivity, FIGS. 1A-1C illustrate plan views of various stages in the fabrication of a solar cell, in accordance with an embodiment of the present disclosure. FIG. 2 is a flowchart 200 listing operations in a method of fabricating a solar cell as corresponding to FIGS. 1A-1C, in accordance with an embodiment of the present disclosure. FIGS. 3A-3G illustrate cross-sectional views of various stages in the fabrication of a solar cell enhancing the description of FIGS. 1A-1C and FIG. 2, in accordance with an embodiment of the present disclosure.

Referring to FIG. 1A and corresponding operation 202 of flowchart 200, a method of fabricating an emitter region of a solar cell includes forming a semiconductor layer 102 above a semiconductor substrate of a first conductivity type (not shown). In a particular embodiment, FIG. 3A illustrates a cross-sectional view illustrating a particular example of FIG. 1A and operation 202 in which a silicon layer 306 is formed on a thin oxide layer 304 disposed on a substrate 302.

Figure 3A:
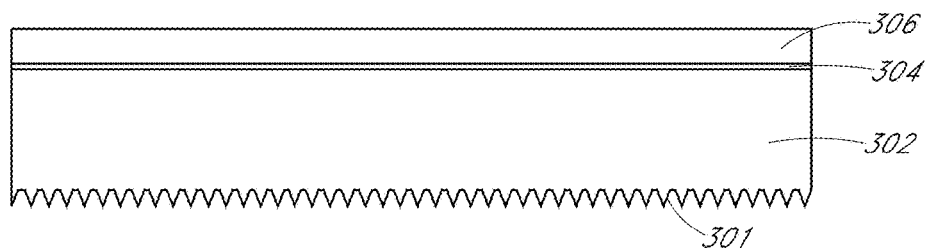
FIGS. 3A-3G illustrate cross-sectional views of various stages in the fabrication of a solar cell enhancing the description of FIGS. 1A-1C and FIG. 2, in accordance with an embodiment of the present disclosure.

Referring specifically to FIG. 3A, in an embodiment, the substrate 302 is a monocrystalline silicon substrate, such as a bulk single crystalline N-type doped silicon substrate. It is to be appreciated, however, that substrate 302 may be a layer, such as a multi-crystalline silicon layer, disposed on a global solar cell substrate. Referring again to FIG. 3A, in an embodiment, as shown, a light receiving surface 301 of the substrate 302 is texturized, as described in greater detail below. In an embodiment, the thin oxide layer 304 is a tunnel dielectric silicon oxide layer having a thickness of approximately 2 nanometers or less. In an embodiment, the silicon layer 306 is an amorphous silicon layer. In one such embodiment, the amorphous silicon layer is formed using low pressure chemical vapor deposition (LPCVD) or plasma enhanced chemical vapor deposition (PECVD). However, in an alternative embodiment, a polycrystalline silicon layer is used instead of amorphous silicon.

Referring again to FIG. 1A and now to corresponding operation 204 of flowchart 200, the method of fabricating an emitter region of a solar cell also includes implanting dopant impurity atoms of a second conductivity type in the semiconductor layer 102 to form an implanted region 104 of the semiconductor layer 102 and resulting in a non-implanted region 106 of the semiconductor layer 102. In the embodiment shown in FIG. 1A, the pattern of dopants is a pattern of one-dimensional (1D) lines. In a particular embodiment, FIGS. 3B-3D illustrate cross-sectional views illustrating a particular example of FIG. 1A and operation 204 in which dopant impurity species are implanted in the silicon layer 306 to form first implanted regions 308 and resulting in non-implanted regions 309 of the silicon layer (i.e., remaining portions of silicon layer 306 that have not been implanted at this stage in the process).

Figure 3B:
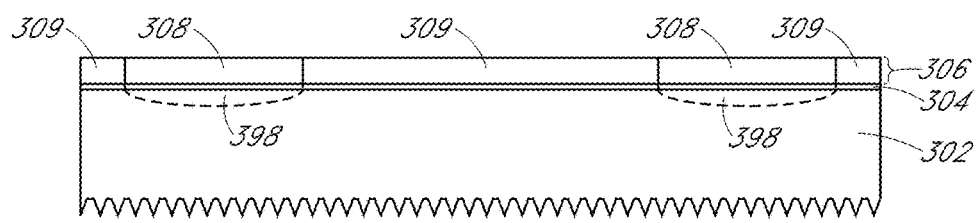

Referring specifically to FIG. 3B, in an embodiment, the implanting is performed by using ion beam implantation or plasma immersion implantation. In one embodiment, this first implanting provides N+ dopant atoms for silicon (e.g., phosphorous or arsenic atoms). In a specific such embodiment, implanting the phosphorous or arsenic atoms or ions involves implanting to form a concentration of phosphorous or arsenic atoms in the silicon layer 306 approximately in the range of 1E19-1E20 atoms/cm$^3$. In an embodiment, the implanting is performed through a first shadow mask, an example of which is described in association with FIG. 9. Referring again to FIG. 3B, it is to be appreciated that the implanting may penetrate through silicon layer 306 and through the thin oxide layer 304 to form diffusion regions 398.

Figure 3C:
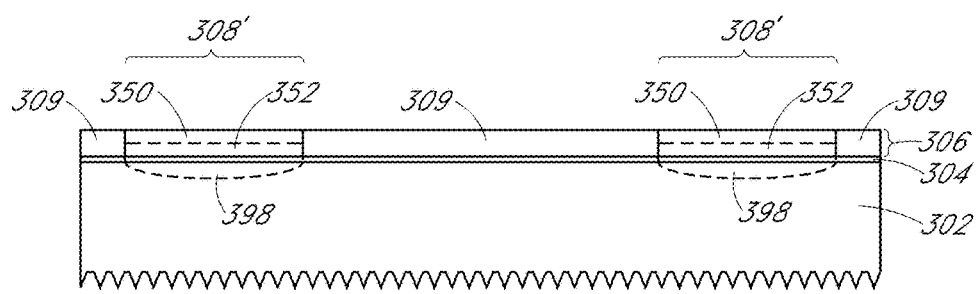

Referring next to FIG. 3C, ancillary impurity species are implanted into the first implanted regions 308 of the silicon layer 306. The ancillary impurity species are different from the dopant impurity species first implanted. Additionally, in an embodiment, the corresponding region of the ancillary impurity species are implanted to have a depth in the silicon layer 306 less than the depth of the respective original first implanted region 308. As such, modified first implanted regions 308' are formed and, in one embodiment, have lower portions 352 that are phosphorous (or arsenic)-only regions 352 and have upper portions 350 that are regions of phosphorous (or arsenic) along with the ancillary impurity species, as is depicted in FIG. 3C. In an embodiment, the ancillary impurity species implanted into the first implanted regions are species such as, but not limited to, nitrogen atoms or ions, carbon atoms or ions, or oxygen atoms or ions. It is to be appreciated that the term "ions" may include molecular ions containing one or more atoms of the dopant species bonded to additional hydrogen atoms. In one embodiment, the ancillary impurity species is nitrogen and is provided by implantation using $N_2$ or $NH_3$. In one embodiment, the ancillary impurity species is carbon and is provided by implantation using $CH_4$ or a hydrocarbon such as acetylene or, possibly, methylsilane. In one embodiment, the ancillary impurity species is oxygen and is provided by implantation using $N_2O$ or $O_2$. In an embodiment, the implanting is performed by using ion beam implantation or plasma immersion implantation. In one embodiment, this second implanting ultimately provides nitrogen atoms, carbon atoms, or oxygen atoms in an upper portion of the N+ regions of the silicon layer 306. In a specific such embodiment, implanting the second implanting form a concentration of nitrogen, carbon or oxygen atoms in the silicon layer 306 approximately in the range of 1E19-1E21 atoms/cm$^3$. In one embodiment, the distribution of the ancillary impurity species is localized predominately within the first 1000 Angstroms below the surface of the silicon layer 306. In an embodiment, the implanting is performed through a second shadow mask, an example of which is described in association with FIG. 9.

Figure 3D:
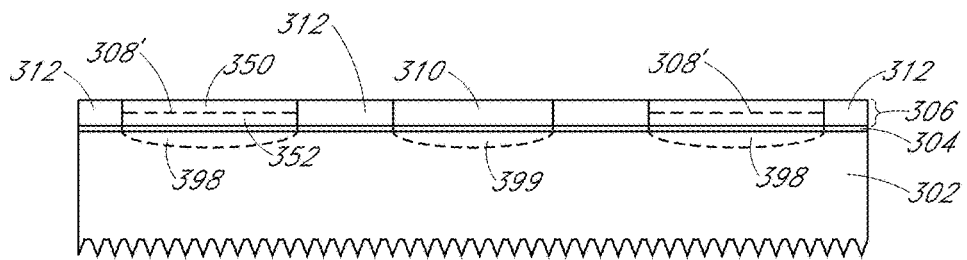

Referring next to FIG. 3D, dopant impurity species of an opposite conductivity type are implanted in the silicon layer 306 to form second implanted regions 310 and resulting in non-implanted regions 312 of the silicon layer (i.e., remaining portions of the silicon layer 306 that were not significantly implanted during any of the above described implantation processes). As in the case for the first and second implantation processes, in an embodiment, the implanting is performed by using ion beam implantation or plasma immersion implantation. In one embodiment, this third implanting provides P+ dopant atoms for silicon (e.g., boron atoms). In a specific such embodiment, implanting the boron atoms or ions involves implanting to form a concentration of boron atoms in the silicon layer 306 approximately in the range of 1E19-1E20 atoms/cm$^3$. In an embodiment, the implanting is performed through a third shadow mask, an example of which is described in association with FIG. 9. Referring again to FIG. 3D, it is to be appreciated that the implanting may penetrate through silicon layer 306 and through the thin oxide layer 304 to form diffusion regions 399.

Referring now to FIG. 1B and to corresponding operation 206 of flowchart 200, the method of fabricating an emitter region of a solar cell also includes laser scribing at least an uppermost portion of the implanted region 104 of the semiconductor layer 102 to form scribe lines 108 in the implanted region 104 of the semiconductor layer 102. In an embodiment, the scribe lines 108 are formed by a pulsed laser ablation process that leaves non-continuous scribe lines across regions 104, as is depicted in FIG. 1B. In another embodiment, the scribe lines 108 are formed by a continuous or an overlapping pulsed laser process that leaves continuous scribe lines across regions 104. In an embodiment, the scribe lines 108 are formed orthogonal to a pattern of 1D lines 104, as is depicted in FIG. 1B. In accordance with an embodiment of the present disclosure, the depth of laser ablation is sufficient to remove areas of etch resistance layer across the line pattern 104.

Referring now to FIG. 1C and to corresponding operation 208 of flowchart 200, the method of fabricating an emitter region of a solar cell also includes removing the non-implanted region 106 (to form etched regions 106') of the semiconductor layer 102 and remaining portions of the semiconductor layer 102 in the scribe lines 108 (to form etched regions 108'). In an embodiment, the removing is performed using a selective etch process preserving remaining non-scribed portions 104' of the implanted region 104 of the semiconductor layer 102. In one embodiment, the removing forming trenches 106' in the semiconductor substrate in locations below the non-implanted region 106 of the semiconductor layer 102 and in locations (e.g., in gaps) 108' below the scribe lines 108. As such, in an embodiment, the etch process reveals a dashed line pattern in the etch resistant ion implant layer. In an embodiment, the trenches 106' and gaps 108' are texturized trenches formed in the semiconductor substrate, as is described in greater detail below. In one such embodiment, the trenches 106' and gaps 108' are formed in the semiconductor substrate using a hydroxide-based wet etchant, as is also described in greater detail below.

Figure 3E:
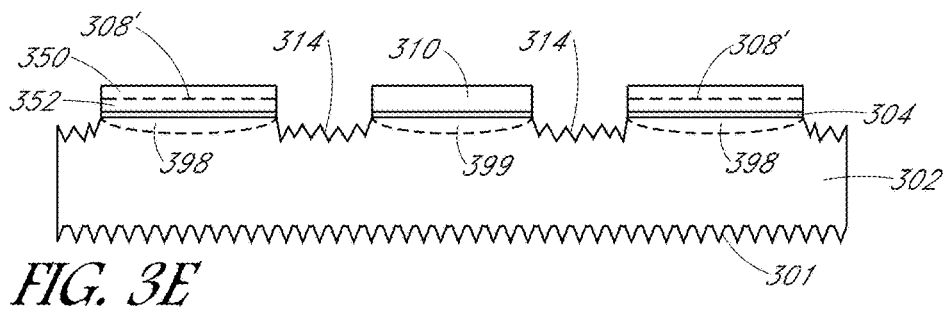

In a particular embodiment, FIG. 3E illustrates a cross-sectional view illustrating a particular example of FIG. 1C and operation 208 corresponding to the formation of etched regions 106'. Referring to FIG. 3E, the remaining non-implanted regions 312 of the silicon layer 306 are removed, for example with a selective etch process, preserving the modified first implanted regions 308' and the second implanted regions 310 of the silicon layer 306.

In embodiment, the ancillary impurity species used to form the modified first implanted regions 308' inhibit the etching (e.g., slow the etch rate of) the modified first implanted regions 308'. In one such embodiment, the ancillary implanted species are employed to affect etch selectivity and are intentionally implanted at lower energies to achieve shallower distributions (e.g., near the surface). In an embodiment, the regions 310 are etch-resistant as formed.

In an embodiment, the remaining non-implanted regions 312 of the silicon layer 306 are removed with a hydroxide-based wet etchant that further removes exposed portions of the thin oxide layer 304 and forms trenches 314 into the substrate 302. The trenches may be formed to provide texturized portions of the substrate 302 as trench bottoms. In an embodiment, since the positioning of trenches 314 is determined by the first implanted regions 308' and the second implanted regions 310 of the silicon layer 306, the trenches 314 are formed as self-aligned between the first implanted regions 308' and the second implanted regions 310 of the silicon layer 306, as is depicted in FIG. 3E. In one embodiment, the hydroxide-based wet etchant treatment is followed by a hydrofluoric acid/ozone (HF/O$_3$) wet clean treatment.

It is to be appreciated that the timing of the texturizing of light receiving surface 301 and self-aligned trench 314 formation may vary. For example, in one embodiment, the texturizing of light receiving surface 301 is performed in a separate process preceding the formation/texturizing of trenches 314, as is represented in FIGS. 3A-3G. However, in another embodiment, the texturizing of light receiving surface 301 is performed in a same process as the formation/texturizing of trenches 314. Furthermore, the timing of formation/texturizing of trenches 314 may vary relative to an anneal process used to crystallize the first implanted regions 308' and the second implanted regions 310. For example, in one embodiment, formation/texturizing of trenches 314 is performed in the process used to remove the remaining non-implanted regions 312 of the silicon layer 306, as is depicted in FIG. 3E. However, in another embodiment, formation/texturizing of trenches 314 is performed following removal of the remaining non-implanted regions 312 of the silicon layer 306 and subsequent anneal process. In an embodiment, a texturized surface (whether in trench 314 or at surface 301) may be one which has a regular or an irregular shaped surface for scattering incoming light, decreasing the amount of light reflected off of the light-receiving and/or exposed surfaces of the solar cell.

Referring again to FIG. 1C and now to corresponding operation 210 of flowchart 200, the method of fabricating an emitter region of a solar cell also includes annealing the semiconductor substrate to form an emitter region of the second conductivity type from the remaining non-scribed portions 104' of the implanted region 104 of the semiconductor layer 102 and to form a region of dopant impurity atoms of the second conductivity type in the semiconductor substrate below the emitter region. In an embodiment, annealing the semiconductor substrate provides an approximately Gaussian distribution of dopant impurity atoms of the second conductivity type in the semiconductor substrate below the implanted region of the semiconductor layer, where a maximum concentration of the approximately Gaussian distribution of dopant impurity atoms of the second conductivity type is approximately in the center of the implanted region of the semiconductor layer, as is described in greater detail below in association with FIG. 4.

Figure 3F:
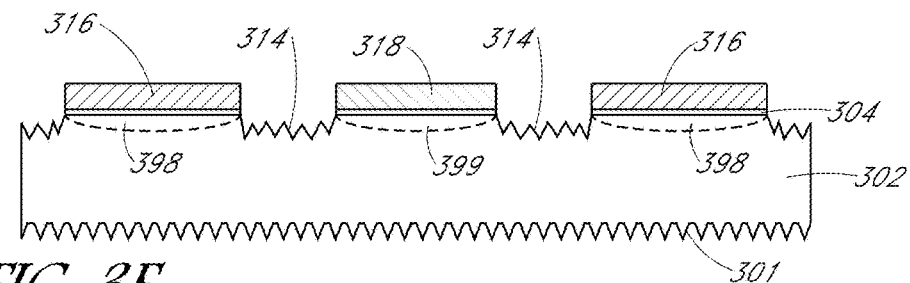
Figure 3G:
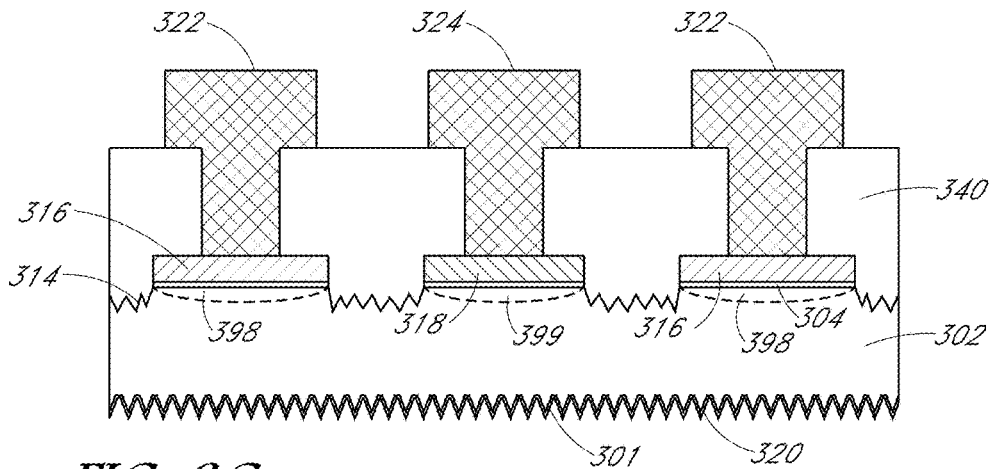

In a particular embodiment, FIG. 3F illustrates a cross-sectional view illustrating a particular example of FIG. 1C and operation 210 where the first implanted regions 308' and the second implanted regions 310 of the silicon layer 306 are annealed to form doped polycrystalline silicon emitter regions 316 and 318, respectively. In an embodiment, the annealing is performed at a temperature approximately in the range of 850-1100 degrees Celsius for a duration approximately in the range of 1-100 minutes. In an embodiment, a light phosphorous dopant drive is performed during the heating or annealing. Additional embodiments can include formation of a passivation or anti-reflective coating layer 320 on the light-receiving surface 301, an example of which is shown in FIG. 3G, described below.

It is to be appreciated that the diffusion regions 398 and 399 described above may be formed at the time of implant (as was described above) or may form (or may be enhanced) during the anneal of operation 210. Additionally, it is to be appreciated that, while it may be generally most advantageous to complete the etch (i.e. removal) of non-implanted areas of silicon layer 306 prior to performing a high temperature anneal and activation process, as is described above, certain implant conditions may result in intrinsically higher reactivity in the texturizing etch (e.g., as relative to non-implanted regions). In such a case, a high temperature anneal can be performed prior to trench etch.

Figure 4:
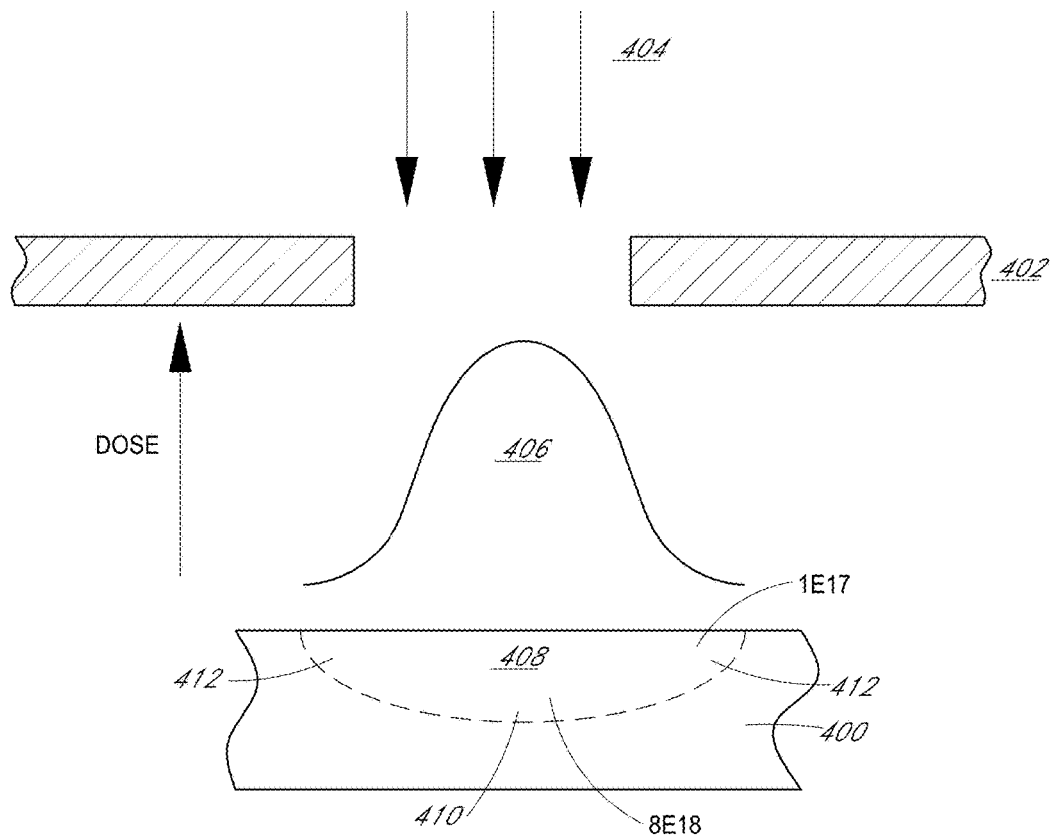
FIG. 4 is a schematic illustrating a Gaussian profile associated with an ion implant process, in accordance with an embodiment of the present disclosure.

Whether the final dopant profile in a substrate is determined by ion implant, by the post implant anneal or by both, FIG. 4 is a schematic illustrating a Gaussian profile associated with an ion implant process (implant or implant and anneal), in accordance with an embodiment of the present disclosure. Referring to FIG. 4, a substrate 400 is subjected to ion implant 404 through an overlying mask 402. A dopant implant region 408 results in the substrate. Since the dose profile 408 of the ion implant 404 has a Gaussian profile 406, and associated Gaussian profile of the diffusion region 408 results with central higher concentration region 410 and outer lower concentration regions 412. In one such embodiment, the regions 412 have a dopant impurity concentration of approximately 8E18, while the region 410 has a dopant impurity concentration of approximately 1E17, as is depicted in FIG. 4.

Figure 5A:
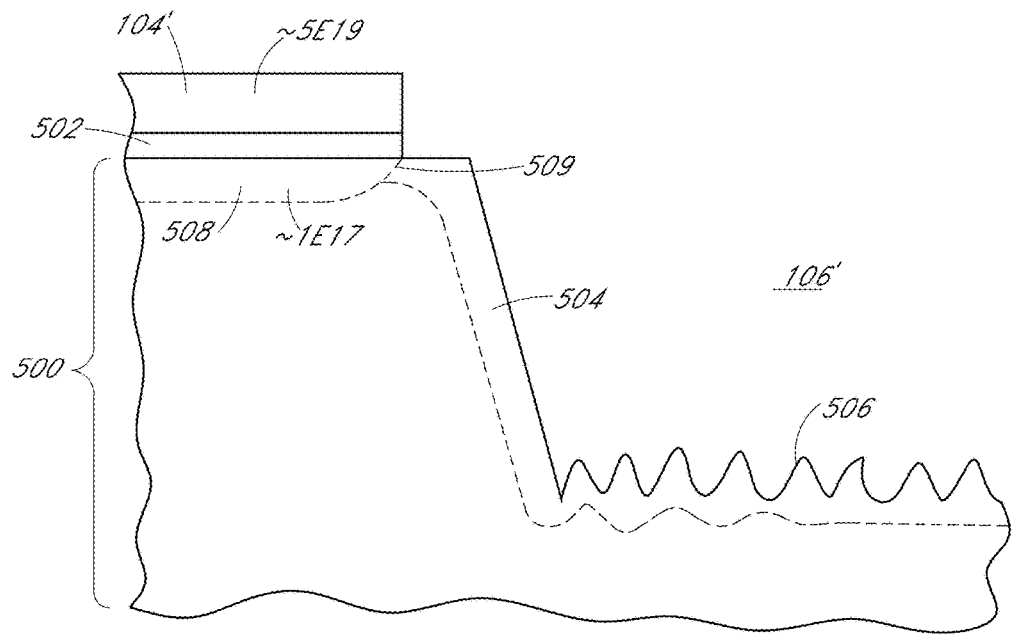
FIG. 5A illustrates a cross-sectional view of a region of a solar cell along a length of a segment 104' of an emitter region of FIG. 1C, in accordance with an embodiment of the present disclosure.
Figure 5B:
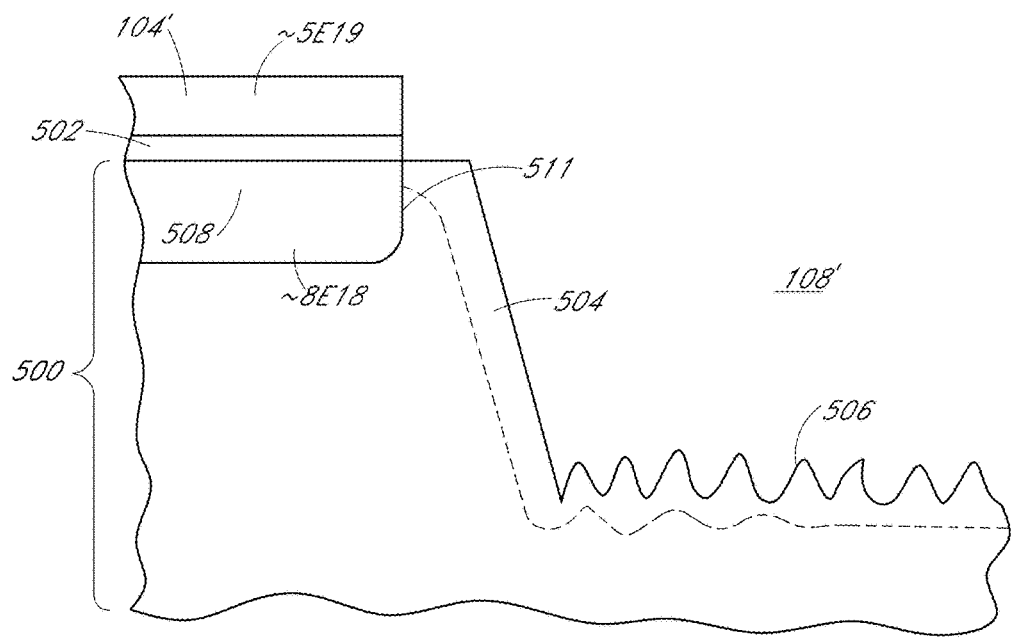
FIG. 5B illustrates a cross-sectional view of a region of a solar cell along a scribed width 108' between segments 104' of an emitter region of FIG. 1C, in accordance with an embodiment of the present disclosure.

To further exemplify the concepts described herein, FIG. 5A illustrates a cross-sectional view of a region of a solar cell along a length of a segment 104' of an emitter region of FIG. 1C, in accordance with an embodiment of the present disclosure. FIG. 5B illustrates a cross-sectional view of a region of a solar cell along a scribed width 108' between segments 104' of an emitter region of FIG. 1C, in accordance with an embodiment of the present disclosure. Referring to FIGS. 5A and 5B, a substrate 500 has a portion of an emitter region segment 104' (e.g., P-type with approximately 5E19 concentration, in one embodiment) formed on a thin dielectric 502 formed on the substrate 500. A dopant region 504 (e.g., N-type) of the substrate 500 is shown near the surface of the substrate 500, including near a texturized surface 506 of the substrate 500.

Referring only to FIG. 5A, trench 106' is shown along the long side of the segment 104' which has a corresponding diffusion region 508 (e.g., P-type) of approximately 1E17 concentration, in one embodiment. An interface 509 of the diffusion region 508 along the long side of the segment 104' is not abrupt or substantially vertical. By contrast, referring only to FIG. 5B, gap 108' is shown between adjacent segments 104' of a given line. At the location shown, segment 504' has a corresponding diffusion region 510 (e.g., P-type) of approximately 8E18 concentration. An interface 511 is described as abrupt or as substantially vertical.

Referring now to FIG. 3G, in an embodiment, conductive contacts are formed on the remaining non-scribed portions of the implanted region of the semiconductor layer. For example, conductive contacts 322 and 324 are fabricated to contact the first 316 and second 318 doped polycrystalline silicon emitter regions, respectively. In an embodiment, the contacts are fabricated by first depositing and patterning an insulating layer 340 to have openings and then forming one or more conductive layers in the openings. In an embodiment, the conductive contacts 322 and 324 include metal and are formed by a deposition, lithographic, and etch approach or, alternatively, a printing process.

It is to be appreciated that a finalized solar cell may be fabricated using the above described processing operations. For example, with reference again to FIGS. 1C, 3G, 5 and 5B, in an exemplary embodiment, a back contact solar cell includes an N-type single crystalline silicon substrate 302 having a light-receiving surface 301 and a back surface. Alternating continuous N-type emitter regions 316 and segmented P-type emitter regions 104'/318 are disposed on the back surface of the N-type single crystalline silicon substrate 302, with gaps 108' between segments 104' of the segmented P-type emitter regions 318. Trenches 106'/314 are included in the N-type single crystalline silicon substrate 302 between the alternating continuous N-type emitter regions 316 and segmented P-type emitter regions 104'/318 and in locations of the gaps 108' between segments 104' of the segmented P-type emitter regions 318. An approximately Gaussian distribution 408 of P-type dopants is included in the N-type single crystalline silicon substrate 302 below the segmented P-type emitter regions 104'/318. A maximum concentration of the approximately Gaussian distribution 408 of P-type dopants is approximately in the center of each of the segmented P-type emitter regions 104'/318 between first and second sides of each of the segmented P-type emitter regions 104'/318. Substantially vertical P/N junctions 511 are included in the N-type single crystalline silicon substrate 302 at the trenches 108' formed in locations of the gaps between segments 104' of the segmented P-type emitter regions 104'/318.

In an embodiment, the trenches 106'/108'/314 in the N-type single crystalline silicon substrate 302 are texturized trenches. In an embodiment, the back contact solar cell further includes a passivation layer disposed in the trenches 108' in locations of the gaps between the segmented P-type emitter regions, as is described in greater detail below in association with FIG. 7A. In an embodiment, the back contact solar cell further includes conductive contacts disposed along the N-type emitter regions and disposed along the segmented P-type emitter regions, as is described in greater detail below in association with FIGS. 7A and 7B. In one such embodiment, the gaps between segments of the segmented P-type emitter regions have a spacing of approximately 30 microns, and the conductive contacts disposed along the segmented P-type emitter regions have a spacing of approximately 60 microns along the segmented P-type emitter regions.

In an embodiment, the P-type dopants used to form the segmented P-type emitter regions 104'/318 are boron dopants, and the N-type emitter regions include phosphorous dopants and an ancillary impurity species selected from the group consisting of nitrogen atoms, carbon atoms, and oxygen atoms. In an embodiment, the alternating continuous N-type emitter regions and segmented P-type emitter regions disposed on the back surface of the N-type single crystalline silicon substrate form a one-dimensional interdigitated finger pattern. It is to be appreciated that, in accordance with another embodiment, the solar cell may instead include continuous P-type emitter regions 318 and segmented N-type emitter regions 316 disposed on the back surface of the N-type single crystalline silicon substrate 302. In yet another embodiment, the solar cell includes segmented P-type emitter regions 318 and segmented N-type emitter regions 316 disposed on the back surface of the N-type single crystalline silicon substrate 302.

Figure 6A:
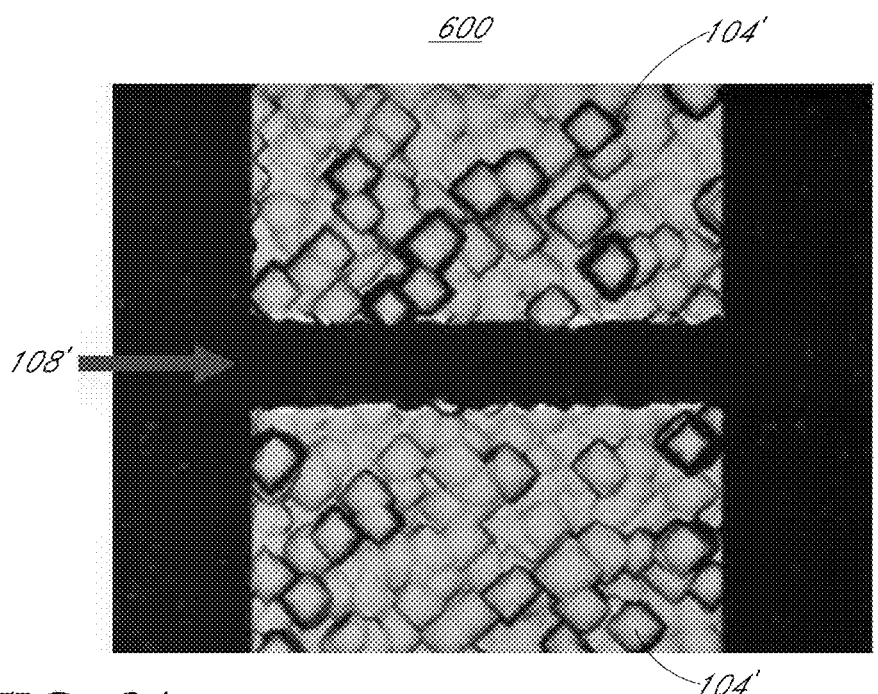
FIG. 6A is an optical image of a plan view showing the gap between adjacent segments of an emitter region of FIG. 1C, in accordance with an embodiment of the present disclosure.
Figure 6B:
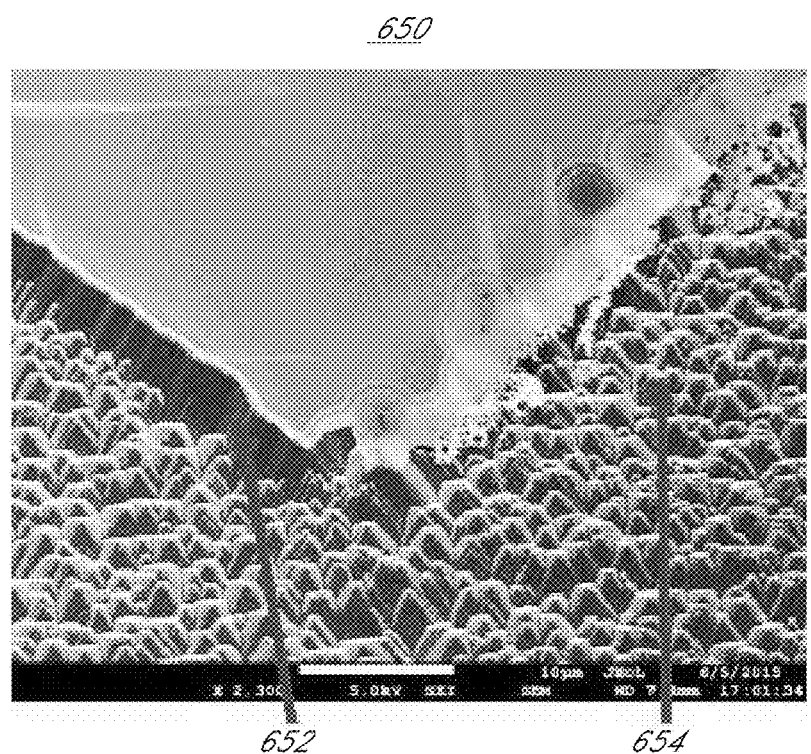
FIG. 6B is a scanning electron microscope (SEM) image showing a laser scribed edge and a non-laser scribed edge of an emitter region of a solar cell for comparative purposes, in accordance with an embodiment of the present disclosure.

To demonstrate some of the concepts involved with embodiments described herein, FIG. 6A is an optical image 600 of a plan view showing the gap 108' between adjacent segments 104' of an emitter region of FIG. 1C, in accordance with an embodiment of the present disclosure. FIG. 6B is a scanning electron microscope (SEM) image 650 showing a laser scribed edge 652 and a non-laser scribed edge 654 of an emitter region of a solar cell for comparative purposes, in accordance with an embodiment of the present disclosure.

It is to be appreciated that breaking continuity of an ion implanted region can involve formation of totally isolated segments, or can involve some level of lesser disruption to the pattern. In a first example, FIG. 7A illustrates a plan view of an emitter line having no continuity between segments of the emitter line, in accordance with an embodiment of the present disclosure. Referring to FIG. 7A, a single emitter line 700 includes segments 702 that are completely isolated from one another (e.g., the scribe is formed entirely through the width of the line 700). Contacts 704 may ultimately be formed along the segments 702, as is depicted in FIG. 7A. Also, isolation material regions 706 (such as silicon nitride regions) may be included between segments 702.

In a second example, FIG. 7B illustrates a plan view of an emitter line having continuity between segments of the emitter line, in accordance with an embodiment of the present disclosure. Referring to FIG. 7B, a single emitter line 750 includes segments 752 that are not completely isolated from one another (e.g., the scribe is not formed entirely through the width of the line 750 and continuity portions 753 are retained). Contacts 754 may ultimately be formed along the segments 752, as is depicted in FIG. 7B. In an embodiment, although not shown, isolation material regions (such as silicon nitride regions) may be included between the segments 752, as was described in association with FIG. 7A.

Referring to both FIGS. 7A and 7B, in either case, in an embodiment, the gaps between segments 702 or 752 of the emitter lines 700 or 750, respectively, have a spacing between adjacent segments of approximately 30 microns. In one such embodiment, the conductive contacts 704 or 754, respectively, along the segmented emitter regions are formed at a spacing of approximately 60 microns along the segmented emitter regions.

Figure 8:
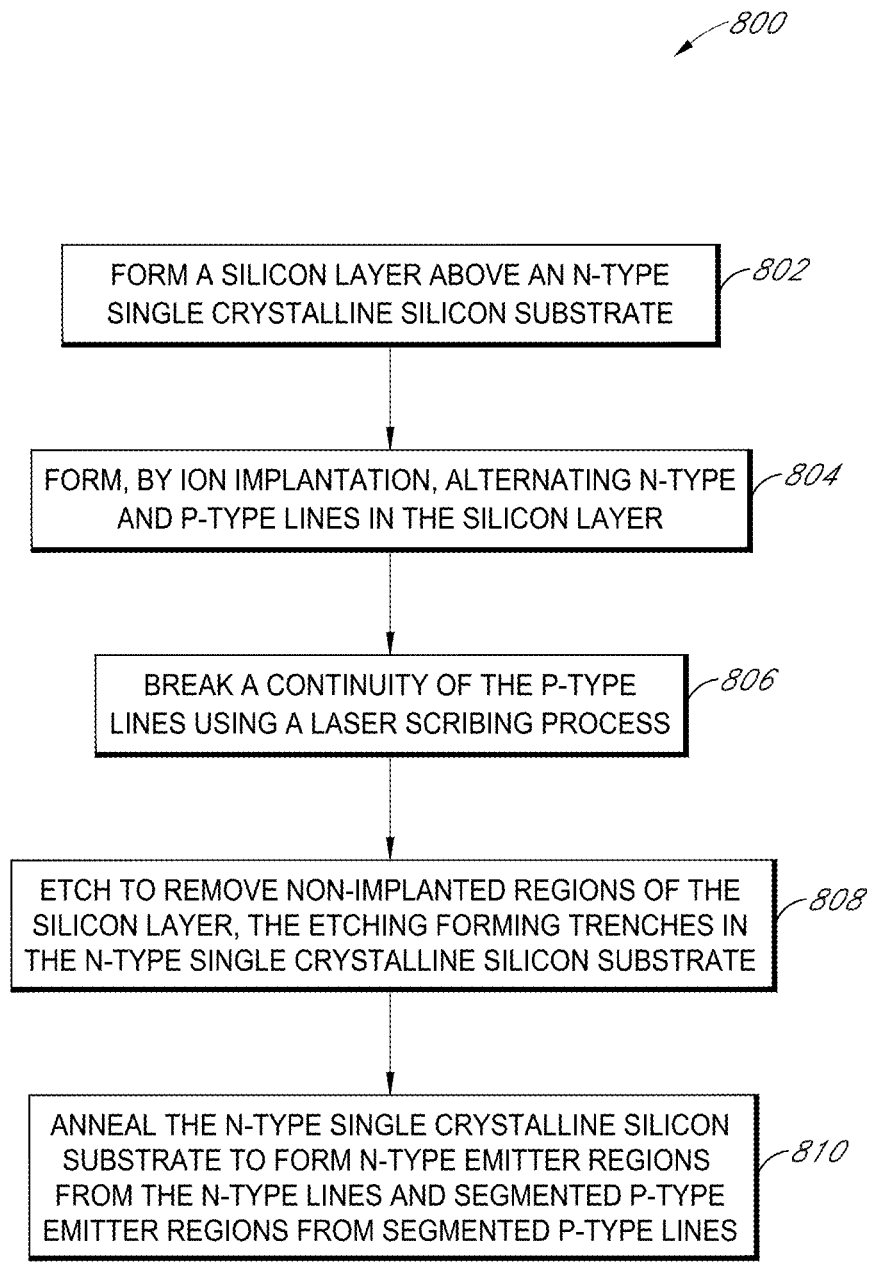
FIG. 8 is a flowchart listing operations in another method of fabricating a solar cell, in accordance with an embodiment of the present disclosure.

As discussed above in association with FIGS. 3A-3G, etch resistance may be provided by both N-type and P-type regions or lines in a silicon layer. One or both of the types of lines may be cut using a laser scribing process. As an example, FIG. 8 is a flowchart 800 listing operations in another method of fabricating a solar cell, in accordance with an embodiment of the present disclosure.

Referring to operation 802 of flow chart 800, a method of fabricating alternating N-type and P-type emitter regions of a solar cell includes forming a silicon layer above an N-type single crystalline silicon substrate, an example of which was described above in association with FIG. 3A. In an embodiment, forming the silicon layer includes forming a silicon layer having a thickness approximately in the range of 250-300 nanometers.

Referring to operation 804 of flow chart 800, the method of fabricating alternating N-type and P-type emitter regions of a solar cell also includes forming, by ion implantation, alternating N-type and P-type lines in the silicon layer with non-implanted regions of the silicon layer remaining between the alternating N-type and P-type lines, an example of which was described above in association with FIGS. 3B-3D.

In an embodiment, the P-type lines are formed by ion implanting boron, and the N-type lines are formed by ion implanting phosphorous and an ancillary impurity species selected from the group consisting of nitrogen atoms, carbon atoms, and oxygen atoms. In an embodiment, forming the alternating N-type and P-type lines in the silicon layer by ion implantation includes using one or more one-dimensional shadow masks to form a one-dimensional interdigitated finger pattern.

Referring to operation 806 of flow chart 800, the method of fabricating alternating N-type and P-type emitter regions of a solar cell also includes breaking a continuity of the P-type lines using a laser scribing process to remove portions of the P-type lines and leave remaining segmented P-type lines with gaps between segments of the P-type lines, an example of which was described above in association with FIG. 1B. In another embodiment, the method involves breaking a continuity of the N-type lines using a laser scribing process to remove portions of the N-type lines and leave remaining segmented N-type lines with gaps between segments of the N-type lines. In yet another embodiment, the method includes breaking a continuity of both the P-type and the N-type lines using a laser scribing process to remove portions of the P-type and N-type lines and leave remaining segmented P-type and segmented N-type lines with gaps between segments of the P-type lines and between segments of the N-type lines.

In an embodiment, as mentioned above, the silicon layer is formed to a thickness approximately in the range of 250-300 nanometers. In one such embodiment, and breaking the continuity of the P-type lines includes laser scribing to a depth of at least approximately 100 nanometers in the silicon layer.

Referring to operation 808 of flow chart 800, the method of fabricating alternating N-type and P-type emitter regions of a solar cell also includes etching to remove the non-implanted regions of the silicon layer remaining between the alternating N-type and P-type lines and in the gaps, the etching forming trenches in the N-type single crystalline silicon substrate between the alternating N-type and P-type lines (an example of which was described above in association with FIG. 3E) and in locations of the gaps between segments of the P-type lines (an example of which for P-type was described above in association with FIG. 1C).

In an embodiment, forming trenches in the N-type single crystalline silicon substrate between the alternating N-type and P-type lines and in locations of the gaps between segments of the segmented P-type lines involves forming texturized trenches, and example of was which described above in association with FIGS. 5A and 5B. In one embodiment, forming trenches in the N-type single crystalline silicon substrate between the alternating N-type and P-type lines and in locations of the gaps between segments of the P-type lines involves using a hydroxide-based wet etchant.

Referring to operation 808 of flow chart 800, the method of fabricating alternating N-type and P-type emitter regions of a solar cell also includes, subsequent to the etching, annealing the N-type single crystalline silicon substrate to form N-type emitter regions from the N-type lines and segmented P-type emitter regions from the segmented P-type lines, an example of which was described above in association with FIG. 3F.

In an embodiment, annealing the N-type single crystalline silicon substrate further includes forming an approximately Gaussian distribution of P-type dopants in the N-type single crystalline silicon substrate, below the segmented P-type emitter regions, an example of which was described above in association with FIG. 4. In one such embodiment, a maximum concentration of the approximately Gaussian distribution of P-type dopants is approximately in the center of each of the segmented P-type emitter regions between first and second sides of each of the segmented P-type emitter regions. In an embodiment, annealing the N-type single crystalline silicon substrate forms substantially vertical P/N junctions in the N-type single crystalline silicon substrate at the trenches formed in locations of the gaps between segments of the P-type lines, an example of which was described above in association with FIG. 5B.

In an embodiment, the method of flowchart 800 further includes forming a passivation layer in the trenches in locations of the gaps between the segmented P-type emitter regions, an example of which was described above in association with FIG. 7A. In an embodiment, the method further includes forming conductive contacts along the N-type emitter regions and along the segmented P-type emitter regions, examples of which were described above in association with FIGS. 7A and 7B. In a specific such embodiment, breaking the continuity of the P-type lines (and/or N-type lines) includes forming the gaps between segments of the P-type lines to have a spacing between adjacent segments of approximately 30 microns, and forming conductive contacts along the segmented P-type emitter regions includes forming conductive contacts at a spacing of approximately 60 microns along the segmented P-type emitter regions.

Figure 9:
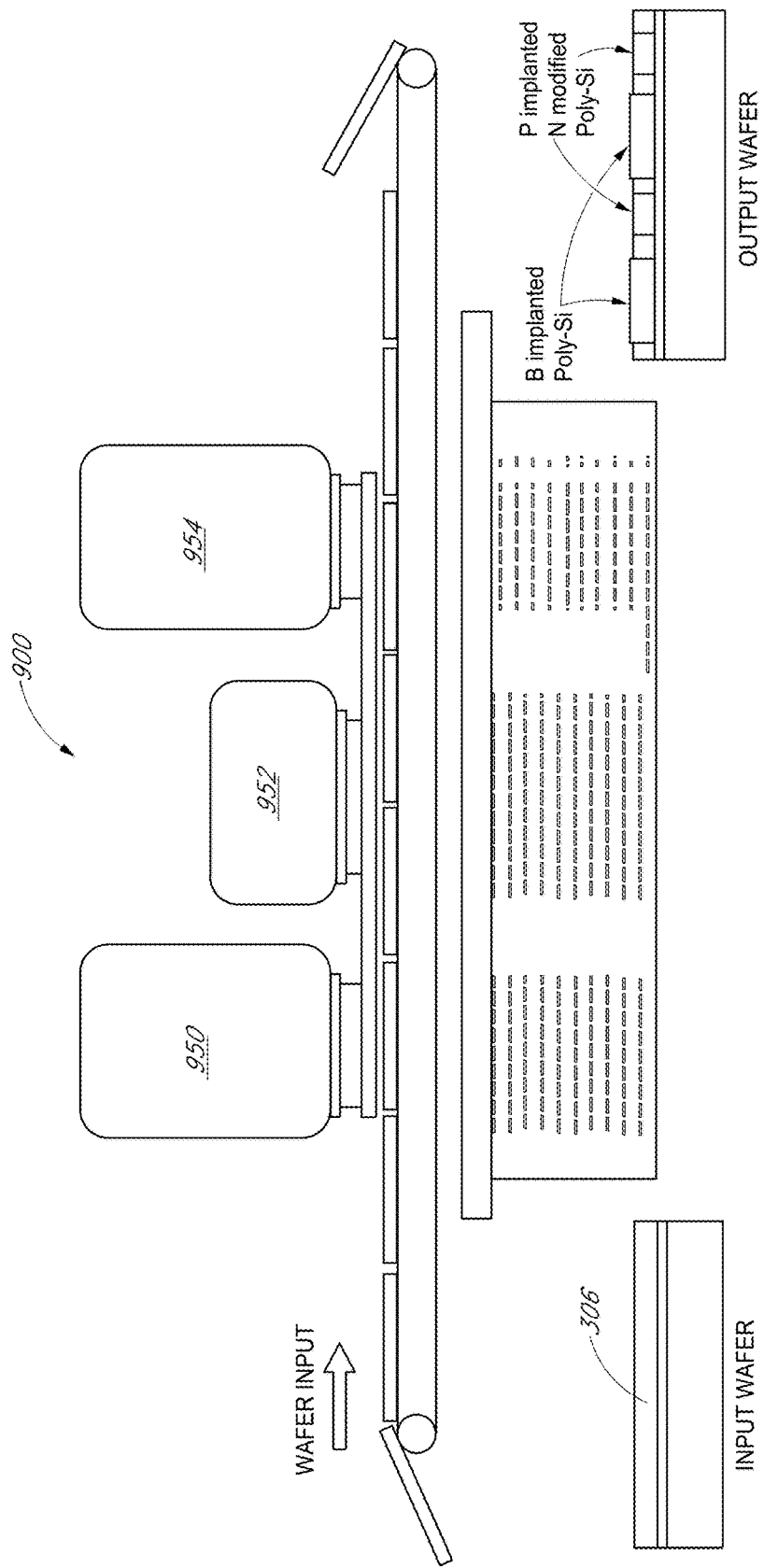
FIG. 9 schematically illustrates a cross-sectional view of an inline platform for patterned implant involving a traveling wafer and stationary shadow mask, in accordance with an embodiment of the present disclosure.

In another aspect, FIG. 9 schematically illustrates a cross-sectional view of an inline platform for patterned implant involving a traveling wafer and stationary shadow mask, in accordance with an embodiment of the present disclosure. Such an inline platform may be used to perform one or more of the ion implanting operations described above.

Referring to FIG. 9, an inline platform 900 includes a wafer input region for an input wafer having a layer of silicon, such as layer 306 described above in association with FIG. 3A. A first station 950 is configured to implant dopant impurity atoms of a first conductivity type through a first shadow mask and into first regions of a material layer 306 disposed above a substrate. A second station 952 is configured to implant ancillary impurity species through a second shadow mask and into the first regions of the material layer 306. A third station 954 is configured to implant dopant impurity atoms of a second, different, conductivity type through a third shadow mask and into second, different, regions of the material layer 306. In a particular embodiment, as exemplified by the output wafer of FIG. 9, the first station 950 is configured to implant phosphorous (or, alternatively, arsenic atoms) or ions, the third station 954 is configured to implant boron atoms or ions, and the second station 952 is configured to implant nitrogen atoms or ions (or, alternatively, carbon atoms or ions, or oxygen atoms or ions).

Referring again to FIG. 9, a stationary stencil mask 902, such as a stationary graphite mask, is held in proximity to, but not in contact with, the substrate during implantation. Although shown as one mask with three corresponding slit patterns, it is to be appreciated that an individual shadow mask will typically be used for each of the modules 950, 952 and 954. The usable distance for spacing from the receiving substrate may be determined by the degree to which the ion beam can be collimated. A typical spacing may be between 50-250 microns which is roughly the same order of thickness as a Si solar wafer substrate. However, the spacing may be as high a 1000 microns (1 mm) under conditions which minimize the angle of divergence (from vertical) below the lower edge of the shadow mask. In an embodiment, the resulting pattern of implanted regions is a one-dimensional interdigitated finger pattern. In other embodiments, a silicon shadow mask is used.

In an embodiment, as described above, a stencil mask such as a stationary graphite shadow mask may be used for implantation. As an example, FIG. 9 schematically illustrates a possible inline platform for patterned implant involving stationary shadow masks, in accordance with an embodiment of the present disclosure. In either of the above described cases, in an embodiment, some deposition or residue accumulation may occur on the stencil masks. After numerous runs, such deposition or accumulation may require removal from the masks. It is to be appreciated that an optimal number of runs may be determined to balance throughput against an over-accumulation of material on the stencil mask that could in some way impact later implantation processes. In one such embodiment, after a certain number of runs, the accumulated material is removed by selective etching, and the stencil mask can then be reused.

Thus, the introduction of new high throughput ion implant tools targeting high efficiency solar applications with patterning capabilities may be applicable to the fabrication of interdigitated back contact (IBC) solar cells. In particular, in cases where physical and chemical changes are associated with performing ion implant operations, such implantation can be exploited to permit the formation of a self-aligned trench pattern.

Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, a polycrystalline or multi-crystalline silicon substrate is used. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. Additionally, although reference is made significantly to back contact solar cell arrangements, it is to be appreciated that approaches described herein may have application to front contact solar cells as well. In general, embodiments described herein may be implemented to provide lower cost, high throughput ion implant platforms for the fabrication of high efficiency interdigitated back contact (IBC)-type solar cells. Specific embodiments can offer an advantageous approach for generating self-aligned trenches among emitter regions formed by implantation. In other embodiments, the above described approaches can be applicable to manufacturing of other than solar cells. For example, manufacturing of light emitting diode (LEDs) may benefit from approaches described herein.

Thus, solar cell fabrication using laser patterning of ion-implanted etch-resistant layers, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A back contact solar cell, comprising:
   an N-type single crystalline silicon substrate having a light-receiving surface and a back surface;
   alternating continuous N-type emitter regions and segmented P-type emitter regions disposed on the back surface of the N-type single crystalline silicon substrate, with gaps between segments of the segmented P-type emitter regions;
   trenches in the N-type single crystalline silicon substrate between the alternating continuous N-type emitter regions and segmented P-type emitter regions and in locations of the gaps between segments of the segmented P-type emitter regions;
   an approximately Gaussian distribution of P-type dopants in the N-type single crystalline silicon substrate below each of the segmented P-type emitter regions, wherein a maximum concentration of the approximately Gaussian distribution of P-type dopants is approximately in the center of each of the segmented P-type emitter regions between first and second sides of each of the segmented P-type emitter regions;
   substantially vertical P/N junctions in the N-type single crystalline silicon substrate at the trenches formed in locations of the gaps between segments of the segmented P-type emitter regions; and
   oxide layers coextensive with each continuous N-type emitter region and each segment of the segmented P-type emitter regions, each oxide layer between the back surface of the N-type single crystalline substrate and the corresponding N-type emitter region or corresponding segment of the segmented P-type emitter regions.

2. The back contact solar cell of claim 1, wherein the trenches in the N-type single crystalline silicon substrate between the alternating continuous N-type emitter regions and segmented P-type emitter regions and in locations of the gaps between segments of the segmented P-type emitter regions are texturized trenches.

3. The back contact solar cell of claim 1, wherein the P-type dopants comprise boron.

4. The back contact solar cell of claim 1, wherein the continuous N-type emitter regions comprise phosphorous.

5. The back contact solar cell of claim 1, wherein the continuous N-type emitter regions comprise arsenic.

6. A solar cell, comprising:
   alternating continuous N-type emitter regions and segmented P-type emitter regions disposed on a surface of a substrate, with gaps between segments of the segmented P-type emitter regions;
   trenches in the substrate between the alternating continuous N-type emitter regions and segmented P-type emitter regions and in locations of the gaps between segments of the segmented P-type emitter regions;
   an approximately Gaussian distribution of P-type dopants in the substrate below each of the segmented P-type emitter regions, wherein a maximum concentration of the approximately Gaussian distribution of P-type dopants is approximately in the center of each of the segmented P-type emitter regions between first and second sides of each of the segmented P-type emitter regions; and
   oxide layers coextensive with each continuous N-type emitter region and each segment of the segmented P-type emitter regions, each oxide layer between the surface of the substrate and the corresponding N-type emitter region or corresponding segment of the segmented P-type emitter regions.

7. The solar cell of claim 6, wherein the trenches in the substrate between the alternating continuous N-type emitter regions and segmented P-type emitter regions and in locations of the gaps between segments of the segmented P-type emitter regions are texturized trenches.

8. The solar cell of claim 6, further comprising:
   substantially vertical P/N junctions in the substrate at the trenches formed in locations of the gaps between segments of the segmented P-type emitter regions.

9. The solar cell of claim 6, wherein the P-type dopants comprise boron.

10. The solar cell of claim 6, wherein the continuous N-type emitter regions comprise phosphorous.

11. The back contact solar cell of claim 6, wherein the continuous N-type emitter regions comprise arsenic.

12. The solar cell of claim 6, wherein the substrate comprises silicon.

13. The solar cell of claim 12, wherein the substrate is a monocrystalline silicon substrate.

14. A solar cell, comprising:
    alternating continuous P-type emitter regions and segmented N-type emitter regions disposed on a surface of a substrate, with gaps between segments of the segmented N-type emitter regions;
    trenches in the substrate between the alternating continuous P-type emitter regions and segmented N-type emitter regions and in locations of the gaps between segments of the segmented N-type emitter regions;

an approximately Gaussian distribution of N-type dopants in the substrate below each of the segmented N-type emitter regions, wherein a maximum concentration of the approximately Gaussian distribution of N-type dopants is approximately in the center of each of the segmented N-type emitter regions between first and second sides of each of the segmented N-type emitter regions; and oxide layers coextensive with each continuous P-type emitter region and each segment of the segmented N-type emitter regions, each oxide layer between the surface of the substrate and the corresponding P-type emitter region or corresponding segment of the segmented N-type emitter regions.

15. The solar cell of claim 14, wherein the trenches in the substrate between the alternating continuous P-type emitter regions and segmented N-type emitter regions and in locations of the gaps between segments of the segmented N-type emitter regions are texturized trenches.

16. The solar cell of claim 14, further comprising:
substantially vertical P/N junctions in the substrate at the trenches formed in locations of the gaps between segments of the segmented N-type emitter regions.

17. The solar cell of claim 14, wherein the N-type dopants comprise phosphorous.

18. The solar cell of claim 14, wherein the N-type dopants comprise arsenic.

19. The solar cell of claim 14, wherein the continuous P-type emitter regions comprise boron.

20. The solar cell of claim 14, wherein the substrate comprises silicon.

21. The solar cell of claim 20, wherein the substrate is a monocrystalline silicon substrate.

* * * * *